(12) United States Patent
Ueki et al.

(10) Patent No.: US 11,752,574 B2
(45) Date of Patent: Sep. 12, 2023

(54) LASER PROCESSING APPARATUS AND ADJUSTMENT METHOD FOR LASER PROCESSING APPARATUS

(71) Applicant: DISCO CORPORATION, Tokyo (JP)

(72) Inventors: Atsushi Ueki, Tokyo (JP); Nobuyuki Kimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 171 days.

(21) Appl. No.: 17/177,492

(22) Filed: Feb. 17, 2021

(65) Prior Publication Data

US 2021/0276123 A1 Sep. 9, 2021

(30) Foreign Application Priority Data

Mar. 9, 2020 (JP) ................................ 2020-040286

(51) Int. Cl.
| | |
|---|---|
| *B23K 26/06* | (2014.01) |
| *B23K 26/53* | (2014.01) |
| *H01L 21/683* | (2006.01) |
| *B23K 26/08* | (2014.01) |
| *H01L 21/78* | (2006.01) |
| *B23K 26/0622* | (2014.01) |

(52) U.S. Cl.
CPC ...... *B23K 26/0665* (2013.01); *B23K 26/0622* (2015.10); *B23K 26/08* (2013.01); *B23K 26/53* (2015.10); *H01L 21/6836* (2013.01); *H01L 21/78* (2013.01)

(58) Field of Classification Search
CPC ......... G03H 1/2294; G03H 2001/0094; G02B 27/0944; G02B 27/0988; G02B 27/0025; G02B 27/0031; G02B 26/0825; G02B 27/0916; G02B 5/0891; B23K 2101/40; B23K 2103/56; B23K 26/032; B23K 26/062; B23K 26/0622; B23K 26/0648; B23K 26/0665; B23K 26/073; B23K 26/08; B23K 26/082; B23K 26/0853; B23K 26/38; B23K 26/53; H01L 21/6836; H01L 21/78

See application file for complete search history.

(56) References Cited

U.S. PATENT DOCUMENTS

| | | | |
|---|---|---|---|
| 2002/0097505 A1* | 7/2002 | DeLong ............... | G02B 17/086 359/726 |
| 2014/0307299 A1* | 10/2014 | Matsumoto .......... | B23K 26/064 359/238 |
| 2020/0256726 A1* | 8/2020 | Scarcelli ............ | G01N 21/6458 |

FOREIGN PATENT DOCUMENTS

| | | |
|---|---|---|
| JP | 2002192370 A | 7/2002 |
| JP | 2019207274 A | 12/2019 |

* cited by examiner

*Primary Examiner* — Philip C Tucker
*Assistant Examiner* — Jimmy R Smith, Jr.
(74) *Attorney, Agent, or Firm* — Greer, Burns & Crain, Ltd.

(57) ABSTRACT

A laser beam irradiation unit of a laser processing apparatus includes a laser oscillator, a condenser lens that condenses a laser beam emitted from the laser oscillator, and a phase modulation element arranged between the laser oscillator and the condenser lens. Individual differences of the condenser lens are prevented by applying, to the phase modulation element, voltages corresponding to a combined pattern of a shape correction pattern which is configured to correct differences between an actual shape and design values of the condenser lens, and an adjustment pattern which is configured to adjust optical characteristics of the laser beam at each processing point.

3 Claims, 9 Drawing Sheets

LASER PROCESSING APPARATUS AND ADJUSTMENT METHOD FOR LASER PROCESSING APPARATUS

BACKGROUND OF THE INVENTION

Field of the Invention

The present invention relates to a laser processing apparatus and an adjustment method for a laser processing apparatus.

Description of the Related Art

As a method for dividing a workpiece such as a semiconductor wafer, there is known a technique that irradiates the inside of the workpiece with a laser beam to form modified layers as brittle regions and then applies external force to divide the workpiece into individual chips (see JP 3408805 B). With a laser processing apparatus that applies a laser beam, the laser beam emitted from a laser oscillator is allowed to propagate through various optical components, is condensed through a condenser lens, and is then applied to a workpiece. However, a variety of optical strains may occur on an optical path of a laser beam, thereby raising a problem that, due to such optical strains, different processing results come out among laser processing apparatuses, in other words, generally-called inter-apparatus differences occur.

Hence, the present assignee and others have investigated a possible cause of the inter-apparatus differences, and it becomes clear that they are often attributable to the individual differences of the condenser lenses. In order to eliminate such inter-apparatus differences, a technique is sometimes used to replace a condenser lens as a primary cause of apparatus differences or to use a wavefront sensor for correction of the spot shapes of a laser beam at processing points (see Japanese Patent Application No. 2019-207274).

SUMMARY OF THE INVENTION

For the elimination of such inter-apparatus differences, however, it is necessary to select condenser lenses having small individual differences, in other words, similar shapes, leading to a problem that a fairly large expense is incurred and a corresponding man-hour for replacement of the lenses is also required. On the other hand, the wavefront sensor that is used to correct the spot shapes of the laser beam is expensive, thereby raising another problem that the apparatus cost increases.

It is therefore an object of the present invention to provide a laser processing apparatus and an adjustment method for a laser processing apparatus, both of which can achieve low cost and prevent inter-apparatus differences.

In accordance with an aspect of the present invention, there is provided a laser processing apparatus including a chuck table configured to hold a workpiece, a laser beam irradiation unit configured to apply a laser beam to the workpiece held on the chuck table, a moving unit configured to relatively move the chuck table and the laser beam irradiation unit, and a control unit configured to control at least the laser beam irradiation unit and the moving unit. The laser beam irradiation unit includes a laser oscillator, a condenser lens that condenses the laser beam emitted from the laser oscillator, and a phase modulation element arranged between the laser oscillator and the condenser lens.

The laser processing apparatus further includes an input unit configured to input a pattern that has been created by mapping voltages to be applied to the phase modulation element, and the control unit inputs a combined pattern of a shape correction pattern which is configured to correct differences between an actual shape and design values of the condenser lens, and an adjustment pattern which is configured to adjust optical characteristics of the laser beam at each processing point, from the input unit, and applies voltages corresponding to the combined pattern to the phase modulation element, thereby preventing individual differences of the condenser lens.

In accordance with another aspect of the present invention, there is provided an adjustment method for adjusting a condensed state of a laser beam to be applied to a workpiece in a laser processing apparatus including a chuck table configured to hold the workpiece, a laser beam irradiation unit configured to apply the laser beam to the workpiece held on the chuck table, a moving unit configured to relatively move the chuck table and the laser beam irradiation unit, a control unit configured to control at least the laser beam irradiation unit and the moving unit, and an input unit configured to input a variety of information. The laser beam irradiation unit includes a laser oscillator, a condenser lens that condenses the laser beam emitted from the laser oscillator, and a phase modulation element arranged between the laser oscillator and the condenser lens. The method includes a pattern creation step of creating a pattern by mapping voltages to be applied to the phase modulation element, an input step of inputting the pattern which has been created in the pattern creation step, from the input unit, a voltage application step of applying voltages which correspond to the pattern inputted in the input step, to the phase modulation element, and a laser beam irradiation step of, after the voltage application step, relatively moving the workpiece and the laser beam while applying the laser beam, thereby applying processing to the workpiece. The pattern to be created in the pattern creation step is a combined pattern of a shape correction pattern which is configured to correct differences between an actual shape and design values of the condenser lens, and an adjustment pattern which is configured to adjust optical characteristics of the laser beam at each processing point.

According to the present invention, inter-apparatus differences can be prevented at low cost.

The above and other objects, features and advantages of the present invention and the manner of realizing them will become more apparent, and the invention itself will best be understood from a study of the following description and appended claims with reference to the attached drawings depicting or illustrating a preferred embodiment of the invention.

DETAILED DESCRIPTION OF THE PREFERRED EMBODIMENT

With reference to the attached drawings, a description will be made in detail regarding an embodiment of the present invention. However, the present invention shall not be limited by details that will be described in the subsequent embodiment. The elements of configurations that will hereinafter be described include those readily conceivable to persons skilled in the art and substantially the same ones. Further, the configurations that will hereinafter be described can be combined appropriately. Furthermore, various omissions, replacements and modifications of configurations can be made without departing from the spirit of the present invention.

Figure 1:
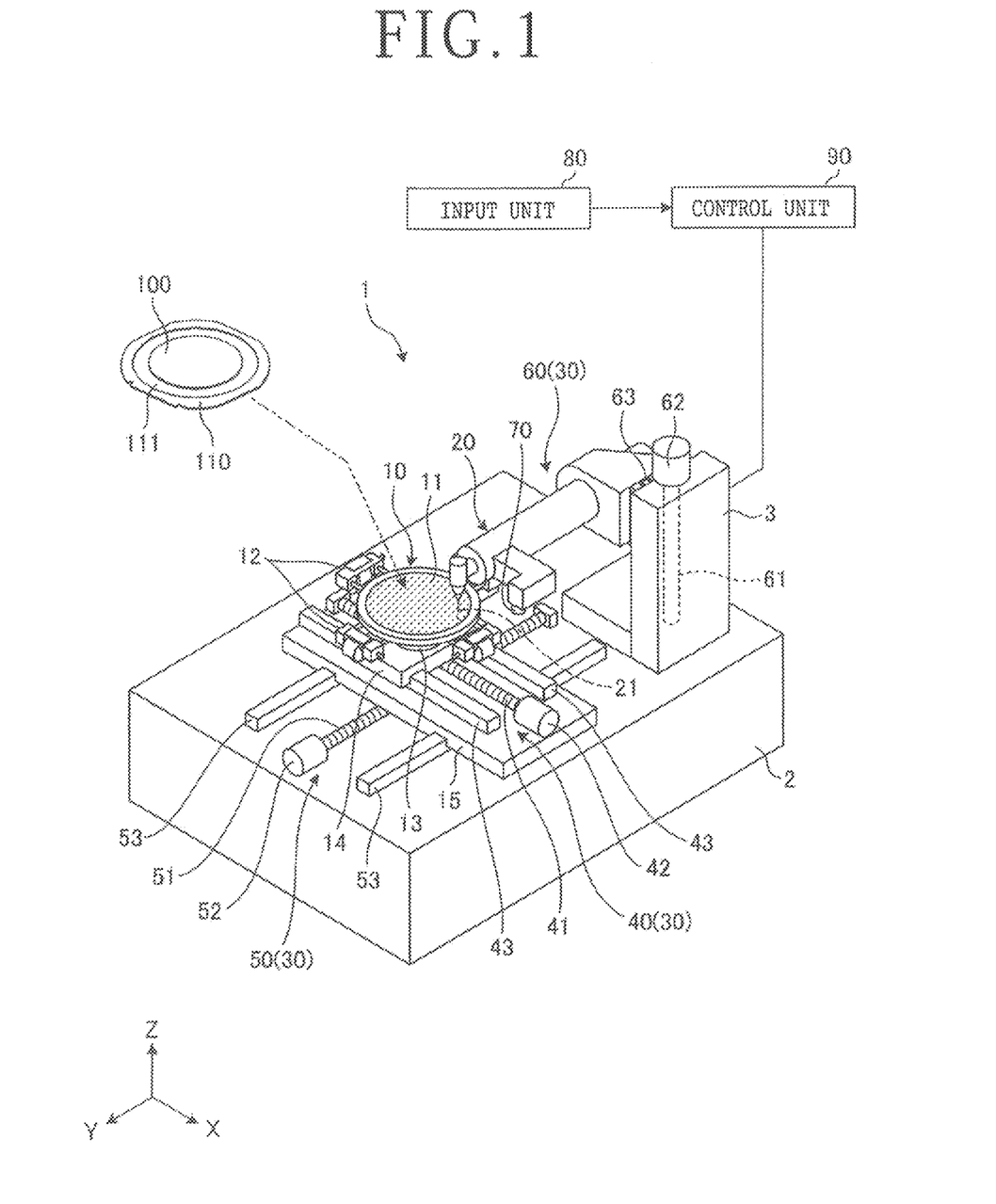
FIG. 1 is a perspective view depicting a configuration example of a laser processing apparatus according to an embodiment.
Figure 2:
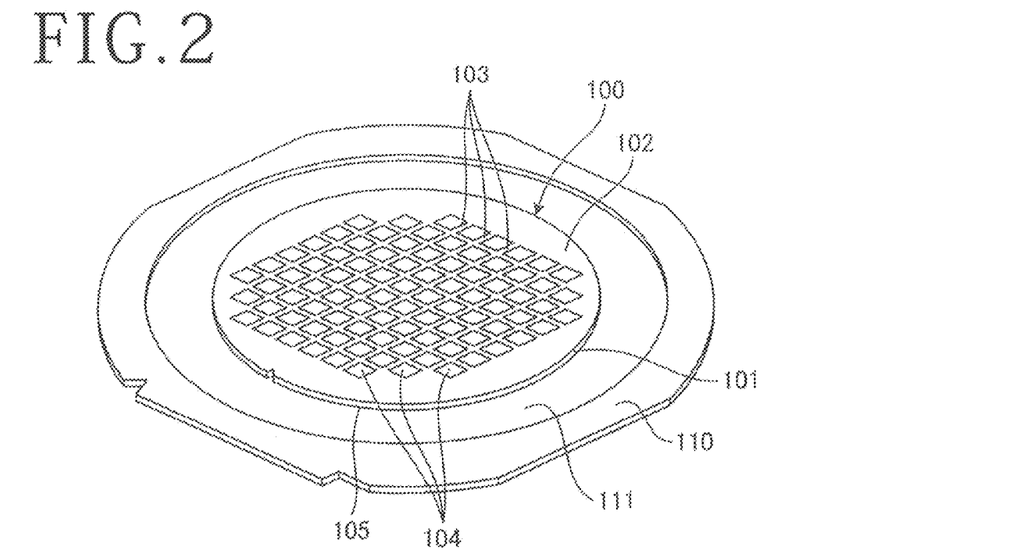
FIG. 2 is a perspective view of a workpiece as an object to be processed by the laser processing apparatus depicted in FIG. 1.

A laser processing apparatus 1 according to the embodiment of the present invention will be described based on the drawings. FIG. 1 is a perspective view depicting a configuration example of the laser processing apparatus 1 according to the embodiment. FIG. 2 is a perspective view of a workpiece 100 as an object to be processed by the laser processing apparatus 1 depicted in FIG. 1.

As depicted in FIG. 1, the laser processing apparatus 1 includes a chuck table 10, a laser beam irradiation unit 20, a moving unit 30, an imaging unit 70, an input unit 80, and a control unit 90. The moving unit 30 includes an X-axis direction moving unit 40, a Y-axis direction moving unit 50, and a Z-axis direction moving unit 60. In the following description, the X-axis direction is a direction in a horizontal plane. The Y-axis direction is a direction that intersects the X-axis direction at right angles in the horizontal plane. The Z-axis direction is a direction that intersects the X-axis direction and Y-axis direction at right angles. In the laser processing apparatus 1 according to the embodiment, a processing feed direction corresponds to the X-axis direction, and an indexing direction corresponds to the Y-axis direction.

The laser processing apparatus 1 according to the embodiment processes the workpiece 100 by applying a pulsed laser beam 21 to the workpiece 100 as the object to be processed. The processing of the workpiece 100 by the laser processing apparatus 1 includes, for example, modified layer forming processing that forms modified layers 106 (see FIG. 3) in the inside of the workpiece 100 by stealth dicing, groove processing that forms grooves in a front surface 102 of the workpiece 100, cutting processing that cuts the workpiece 100 along streets 103, or the like. In the embodiment, a description will be made regarding a configuration that forms the modified layers 106 in the workpiece 100. The workpiece 100 is a wafer such as a disc-shaped semiconductor wafer or a disc-shaped optical device wafer in which silicon (Si), sapphire ($Al_2O_3$), gallium arsenide (GaAs), silicon carbide (SiC), or the like is used as a substrate 101.

As depicted in FIG. 2, the workpiece 100 has the streets 103 set in a grid pattern on the front surface 102 of the substrate 101, and devices 104 formed in regions defined by the streets 103. The devices 104 are, for example, integrated circuits such as integrated circuits (ICs) or large scale integrations (LSIs), or image sensors such as charge coupled devices (CCDs) or complementary metal oxide semiconductors (CMOSs). In the embodiment, the modified layer 106 (see FIG. 3) are formed along each street 103 in the inside of the workpiece 100. A ring-shaped frame 110 is bonded on a tape 111 having a larger diameter than an outer diameter of the workpiece 100, and the tape 111 is bonded to a back surface 105 of the workpiece 100 on a back side of the front surface 102, so that the workpiece 100 is supported in an opening of the ring-shaped frame 110.

As depicted in FIG. 1, the chuck table 10 holds the workpiece 100 on a holding surface 11 thereof. The holding surface 11 is formed from a porous ceramic or the like, and has a disc shape. In the embodiment, the holding surface 11 is a plane parallel to the horizontal direction. The holding surface 11 is connected, for example, to a vacuum suction source via a vacuum suction line. The chuck table 10 holds under suction the workpiece 100 placed on the holding surface 11. On a periphery of the chuck table 10, a plurality of clamp portions 12 are disposed to grasp the ring-shaped frame 110 with the workpiece 100 supported thereon. The chuck table 10 is rotated by a rotating unit 13 about an axis thereof that is parallel to the Z-axis direction. The rotating unit 13 is supported on an X-axis direction moving plate 14. The rotating unit 13 and the chuck table 10 are moved in the X-axis direction by the X-axis direction moving unit 40 via the X-axis direction moving plate 14. The rotating unit 13 and the chuck table 10 are moved in the Y-axis direction by the Y-axis direction moving unit 50 via the X-axis direction moving plate 14, the X-axis direction moving unit 40, and a Y-axis direction moving plate 15.

The laser beam irradiation unit 20 applies the pulsed laser beam 21 to the workpiece 100 held on the chuck table 10. In the laser beam irradiation unit 20, at least a condenser lens 27 (see FIG. 3) is supported on the Z-axis direction moving unit 60 disposed on a post 3 that is arranged upright from a apparatus main body 2 of the laser processing apparatus 1. A detailed configuration of the laser beam irradiation unit 20 will be described subsequently herein.

As depicted in FIG. 1, the X-axis direction moving unit 40 relatively moves the chuck table 10 and the laser beam irradiation unit 20 in the X-axis direction, that is, the processing feed direction. In the embodiment, the X-axis direction moving unit 40 moves the chuck table 10 in the X-axis direction. In the embodiment, the X-axis direction moving unit 40 is disposed over the apparatus main body 2 of the laser processing apparatus 1. The X-axis direction moving unit 40 supports the X-axis direction moving plate 14 movably in the X-axis direction. The X-axis direction moving unit 40 includes a known ball screw 41, a known pulse motor 42, and known guide rails 43. The ball screw 41 is disposed rotatably about an axis thereof. The pulse motor 42 rotates the ball screw 41 about the axis thereof. The guide rails 43 support the X-axis direction moving plate 14 movably in the X-axis direction. The guide rails 43 are fixedly disposed on the Y-axis direction moving plate 15.

The Y-axis direction moving unit 50 relatively moves the chuck table 10 and the laser beam irradiation unit 20 in the Y-axis direction, that is, the indexing feed direction. In the embodiment, the Y-axis direction moving unit 50 moves the chuck table 10 in the Y-axis direction. In the embodiment, the Y-axis direction moving unit 50 is disposed on the apparatus main body 2 of the laser processing apparatus 1. The Y-axis direction moving unit 50 supports the Y-axis direction moving plate 15 movably in the Y-axis direction. The Y-axis direction moving unit 50 includes a known ball screw 51, a known pulse motor 52, and known guide rails 53. The ball screw 51 is disposed rotatably about an axis thereof. The pulse motor 52 rotates the ball screw 51 about the axis thereof. The guide rails 53 support the Y-axis direction moving plate 15 movably in the Y-axis direction. The guide rails 53 are fixedly disposed on the apparatus main body 2.

The Z-axis direction moving unit 60 relatively moves the chuck table 10 and the laser beam irradiation unit 20 in the Z-axis direction, that is, a focal-point position adjusting direction. In the embodiment, the Z-axis direction moving unit 60 moves the laser beam irradiation unit 20 in the Z-axis direction. In the embodiment, the Z-axis direction moving unit 60 is disposed on the post 3 that is arranged upright from the apparatus main body 2 of the laser processing apparatus 1. The Z-axis direction moving unit 60 supports at least the condenser lens 27 (see FIG. 3) out of the elements of the laser beam irradiation unit 20 movably in the Z-axis direction. The Z-axis direction moving unit 60 includes a known ball screw 61, a known pulse motor 62, and known guide rails 63. The ball screw 61 is disposed rotatably about an axis thereof. The pulse motor 62 rotates the ball screw 61 about the axis thereof. The guide rails 63 support the laser beam irradiation unit 20 movably in the Z-axis direction. The guide rails 63 are fixedly disposed on the post 3.

The imaging unit 70 images the workpiece 100 held on the chuck table 10. The imaging unit 70 includes a CCD camera or infrared camera that images the workpiece 100 held on the chuck table 10. The imaging unit 70 is fixed, for example, so as to be adjacent to the condenser lens 27 (see FIG. 3) of the laser beam irradiation unit 20. The imaging unit 70 images the workpiece 100, acquires an image for use in executing an alignment to perform position matching between the workpiece 100 and the laser beam irradiation unit 20, and outputs the thus-acquired image to the control unit 90.

The input unit 80 inputs a variety of information. The input unit 80 can receive the variety of information such as information regarding processing details to be recorded by an operator. The input unit 80 can receive an operation that inputs a combined pattern 244 (for example, see FIG. 8) of a shape correction pattern 242 (for example, see FIG. 6) and an adjustment pattern 243 (for example, see FIG. 7), all of which will be described subsequently herein. The input unit 80 may be an external input device such as a keyboard. If the laser processing apparatus 1 has a display device including a keyboard or the like, the input unit 80 may be included in the display device.

The control unit 90 controls the above-described individual elements of the laser processing apparatus 1, thereby causing the laser processing apparatus 1 to execute processing operation on the workpiece 100. The control unit 90 controls the laser beam irradiation unit 20, the moving unit 30 and the imaging unit 70. The control unit 90 is a computer that includes a computing section as computing means, a storage section as storage means, and an input/output interface device as communication means. The computing section includes, for example, a microprocessor such as a central processing unit (CPU). The storage section has a memory such as a read only memory (ROM) or a random access memory (RAM). The computing section performs a variety of computing processing based on predetermined programs stored in the storage section. According to the results of the processing, the computing section outputs various control signals to the above-described individual elements via the input/output interface device to execute control of the laser processing apparatus 1.

To a phase modulation element 24 (see FIG. 3) to be described subsequently herein, the control unit 90 applies voltages corresponding, for example, to a pattern inputted from the input unit 80. The control unit 90 causes, for example, the imaging unit 70 to image the workpiece 100. The control unit 90 performs image processing of an image captured, for example, by the imaging unit 70. The control unit 90 detects, for example, processing lines on the workpiece 100 by the image processing. The control unit 90 drives, for example, the X-axis direction moving unit 40 such that a processing point 28 (see FIG. 3) as the focal point of the laser beam 21 moves along each processing line, and also causes the laser beam irradiation unit 20 to apply the laser beam 21.

Figure 3:
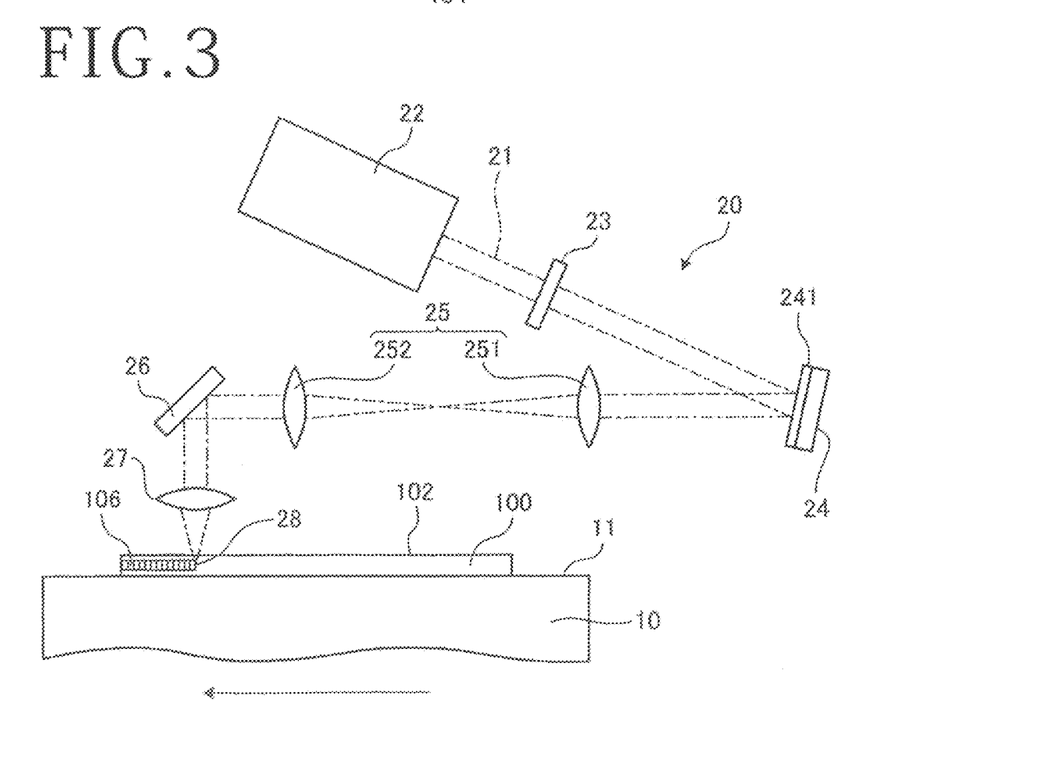
FIG. 3 is a schematic diagram schematically illustrating a configuration of a laser beam irradiation unit of the laser processing apparatus depicted in FIG. 1.

A description will next be made in detail regarding the laser beam irradiation unit 20. FIG. 3 is a schematic diagram schematically illustrating a configuration of the laser beam irradiation unit 20 of the laser processing apparatus 1 depicted in FIG. 1. As illustrated in FIG. 3, the laser beam irradiation unit 20 includes a laser oscillator 22, a polarizing plate 23, the phase modulation element 24, a lens group 25, a mirror 26, and the condenser lens 27.

An arrow in FIG. 3 indicates a moving direction of the chuck table 10 during processing feed. Further, the processing points 28 as focal points of the laser beam 21 are set in the inside of the workpiece 100 in the embodiment. By performing processing feed of the chuck table 10 while applying the laser beam 21 to the processing points 28, the modified layer 106 is formed along the corresponding street 103 (see FIG. 2) in the inside of the workpiece 100.

The modified layer 106 means a region changed into a state in which it is different in density, refractive index, mechanical strength, or other physical characteristics from a surrounding region. The modified layer 106 is, for example, a fusion-processed region, a cracked region, a dielectric breakdown region, a refractive index changed region, a region where two or more of such regions are mixed, or the like. Each modified layer 106 is lower in mechanical strength or the like than the other parts of the workpiece 100.

The laser oscillator 22 oscillates a laser having a predetermined wavelength for processing the workpiece 100, and emits the laser beam 21. In the embodiment, the laser beam 21 to be applied from the laser beam irradiation unit 20 is of a wavelength having transmissivity through the workpiece 100.

The polarizing plate 23 is arranged between the laser oscillator 22 and the phase modulation element 24. The polarizing plate 23 polarizes the laser beam 21, which has been emitted from the laser oscillator 22, into light in a specific direction.

The phase modulation element 24 is arranged between the laser oscillator 22 and the condenser lens 27. The phase modulation element 24 performs phase modulation of the incident laser beam 21. The phase modulation element 24 modulates the phase of the laser beam 21, which has been emitted from the laser oscillator 22, by electrically controlling spatial distributions of the amplitude, phase, and the like of the laser beam 21. Corresponding to a pattern inputted from the input unit 80, voltages are applied from the control unit 90, and accordingly, the phase modulation element 24 forms the laser beam 21 into a desired beam shape. As a consequence, the output power and spot shape of the laser beam 21 at the processing point 28 are adjusted.

The pattern is a mapping of the voltages to be applied to the phase modulation element 24. The pattern to be applied to the phase modulation element 24 in the embodiment is the combined pattern 244 (see FIG. 8) of the shape correction pattern 242 (see FIG. 6) and the adjustment pattern 243 (see FIG. 7). The shape correction pattern 242 is a pattern for use in correcting the aberrations of the condenser lens 27. The adjustment pattern 243 is a pattern for use in adjusting the optical characteristics of the laser beam 21 at the processing point 28. The adjustment of the optical characteristics includes, for example, a shape change, intensity attenuation, and the like of the laser beam 21. The laser processing apparatus 1 can adjust the output power and spot shape of the laser beam 21 at the processing point 28 by changing at least one of the shape correction pattern 242 and the adjustment pattern 243 with respect to the voltages to be applied to the phase modulation element 24.

In this embodiment, the phase modulation element 24 is a spatial optical modulator (the liquid crystal on silicon (LCOS) type) manufactured by Hamamatsu Photonics K.K. The phase modulation element 24 in the embodiment has a display portion 241. The display portion 241 includes liquid crystal elements. The display portion 241 displays the pattern. When the voltages corresponding to the combined pattern 244 inputted from the input unit 80 are applied from the control unit 90, the phase modulation element 24 causes the display portion 241 to display the combined pattern 244. As a consequence, the laser beam 21 that is reflected at or transmitted through the phase modulation element 24 is modulated in phase and shaped in beam form according to the combined pattern 244, whereby the output power and spot shape of the laser beam 21 at the processing point 28 are adjusted.

The phase modulation element 24 reflects to output the laser beam 21 in the embodiment and may transmit to output the laser beam 21 in the present invention. Further, the phase modulation element 24 is not limited to the spatial optical modulator and may be a deformable mirror. If the phase modulation element 24 is a deformable mirror, the phase modulation element 24 deforms a mirror film according to the combined pattern 244 when the voltages corresponding to the combined pattern 244 are applied. The LCOS-type spatial optical modulator uses a wavelength of 405 nm or longer (specifically, a green or infrared (IR) laser), while the deformable mirror is usable even at 355 nm. The deformable mirror can therefore be also used in ablation processing by an ultraviolet (UV) laser.

The lens group 25 is arranged between the phase modulation element 24 and the condenser lens 27. The lens group 25 is a 4f optical system formed from two lenses, a lens 251 and lens 252. The 4f optical system is an optical system in which the back focal plane of the lens 251 and the front focal plane of the lens 252 coincide with each other and an image on the front focal plane of the lens 251 is formed on the back focal plane of the lens 252. The lens group 25 enlarges or reduces the beam diameter of the laser beam 21 outputted from the phase modulation element 24.

The mirror 26 reflects the laser beam 21 toward the workpiece 100 held on the holding surface 11 of the chuck table 10. In the embodiment, the mirror 26 reflects the laser beam 21 toward the condenser lens 27 after it passes through the lens group 25.

The condenser lens 27 condenses the laser beam 21 which has been emitted from the laser oscillator 22 and applies to the workpiece 100 held on the holding surface 11 of the chuck table 10. The condenser lens 27 is a single lens in the embodiment. The condenser lens 27 condenses the laser beam 21 at the processing point 28 after its reflection by the mirror 26.

Figure 4:
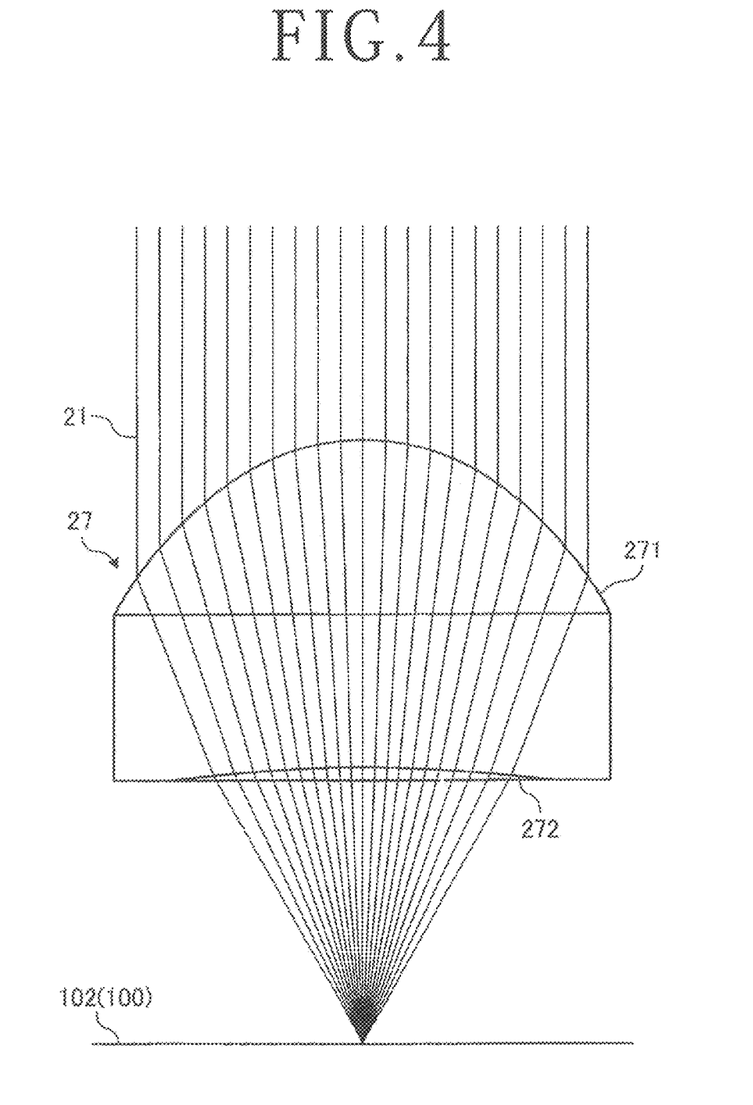
FIG. 4 is a schematic diagram illustrating an example of a condenser lens.
Figure 5:
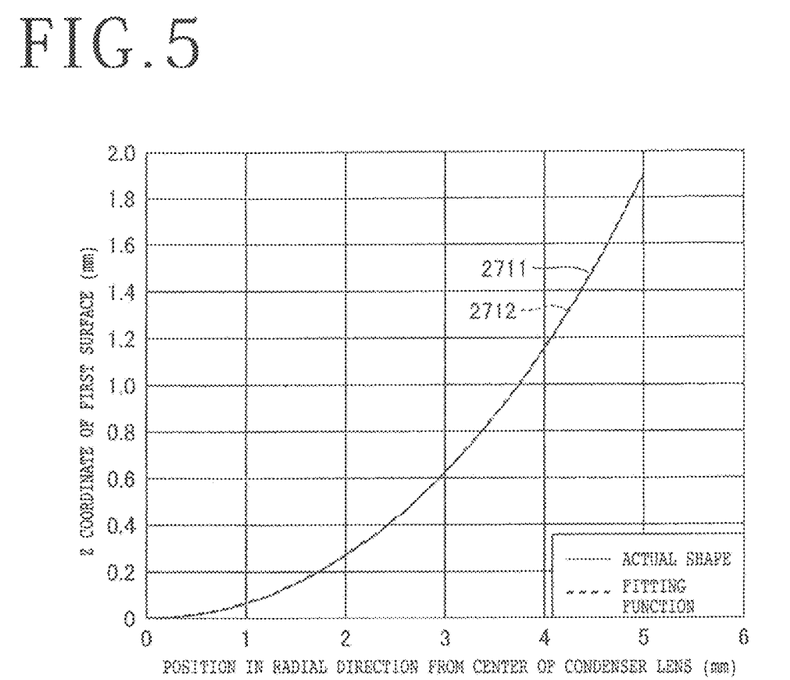
FIG. 5 is a graph indicating an example of a relation between positions in a radial direction from a center of the condenser lens and Z coordinates of a first surface of the condenser lens.

Pattern creation methods will next be described. FIG. 4 is a schematic diagram illustrating an example of the condenser lens 27. FIG. 5 is a graph indicating an example of a relation between positions in a radial direction from a center of the condenser lens 27 and Z coordinates of a first surface 271 of the condenser lens 27. The abscissa in FIG. 5 represents the position in the radial direction from the center of the condenser lens 27, and the ordinate in FIG. 5 represents the Z ordinate of the first surface 271. It is to be noted that, in FIG. 5, the origin 0 in the Z-axis direction indicates the position of the first surface 271 in the Z-axis direction at the center in the radial direction of the condenser lens 27. In other words, FIG. 5 presents differences in the Z-axis direction of the first surface 271 relative to the center of the condenser lens 27 at individual positions different in the radial direction from the center of the condenser lens 27.

As illustrated in FIG. 4, the condenser lens 27 in the embodiment includes the first surface 271 that is a convex spherical surface, and a second surface 272 that is a concave spherical surface. Lenses purchased from a manufacturer are those having permissible deviations within tolerance ranges relative to the design values of lens surfaces. For example, the manufacturer makes a measurement of a lens shape on every lens, for example, by a contact-type measuring instrument with respect to deviations of its lens surfaces from their design values, and discloses its purchaser the distributions of measurement values of the shape at positions in the radial direction from the center of the lens.

In the creation method of the shape correction pattern 242, as illustrated in FIG. 5, a fitting function 2712, an example of which is indicated by a dashed line in FIG. 5, in terms of Z coordinates of the first surface 271 at the positions in the radial direction from the center of the condenser lens 27 is first prepared by fitting an actual shape 2711, which is indicated by a solid line in FIG. 5, in terms of Z coordinates of the first surface 271 at the positions in the radial direction from the center of the condenser lens 27. As the actual shape 2711 of the condenser lens 27, the measurement values furnished from the manufacturer as described above may be used, or measurement values measured by a source other than the manufacturer may be used. The fitting function 2712 is prepared by a known method that uses the R language, numerical-analysis software, and the like. The fitting function 2712 indicates the Z coordinates of the first surface 271 at the individual positions in the radial direction from the center of the condenser lens 27.

Assuming that the shape of the first surface 271 of the condenser lens 27 is represented by the fitting function 2712, aberrations after transmission through the condenser lens 27 are next calculated by a known ray tracing software or the like. Based on the differences of the calculated aberrations, correction values are calculated so as to provide an ideal wavefront, and the shape correction pattern 242 is created using the correction values. The ideal wavefront is the wavefront of the laser beam 21 after its transmission through the condenser lens 27 having the first surface 271 of the shape according to the design values. In other words, the ideal wavefront is spatial distributions of the phase of the laser beam 21, with which desired processing results are obtained corresponding to processing conditions set in the laser processing apparatus 1.

Specifically, assuming that the shape of the first surface 271 of the condenser lens 27 is represented by the fitting function 2712, Zernike coefficients corresponding to the aberrations of the condenser lens 27 are first calculated by the known ray tracing software or the like. The Zernike coefficients are values calculated by performing Zernike polynomial approximation on the wavefront of the laser beam 21 after its transmission through the condenser lens 27 as calculated by the known ray tracing software, and correspond to the aberrations of the condenser lens 27. It is understood that a Zernike polynomial is an orthogonal polynomial defined on a unit circle.

From the calculated Zernike coefficients, correction values (hereinafter referred to as "the Zernike coefficient correction values") are next determined to provide Zernike coefficients of the ideal wavefront of the laser beam 21 after its transmission through the condenser lens 27. Further, using the Zernike coefficient correction values, a pattern is created by mapping voltages to be applied to the phase modulation element 24, and the created pattern is provided as the shape correction pattern 242.

Now, assuming that the shape of the first surface 271 of the condenser lens 27 is represented by the fitting function 2712, the calculated Zernike coefficients are values calculating by performing Zernike polynomial approximation on the wavefront of the laser beam 21 after its transmission through the condenser lens 27 as calculated by the known ray tracing software or the like. Therefore, the calculated Zernike coefficients are values corresponding to the deviations of the shape of the first surface 271 of the condenser lens 27 from its design values. On the other hand, the Zernike coefficient correction values are values for approximating the wavefront of the laser beam 21 after its transmission through the condenser lens 27 to the ideal wavefront. The shape correction pattern 242 is hence a pattern for approximating the wavefront of the laser beam 21 after its transmission through the condenser lens 27 to the ideal wavefront.

Figure 6:
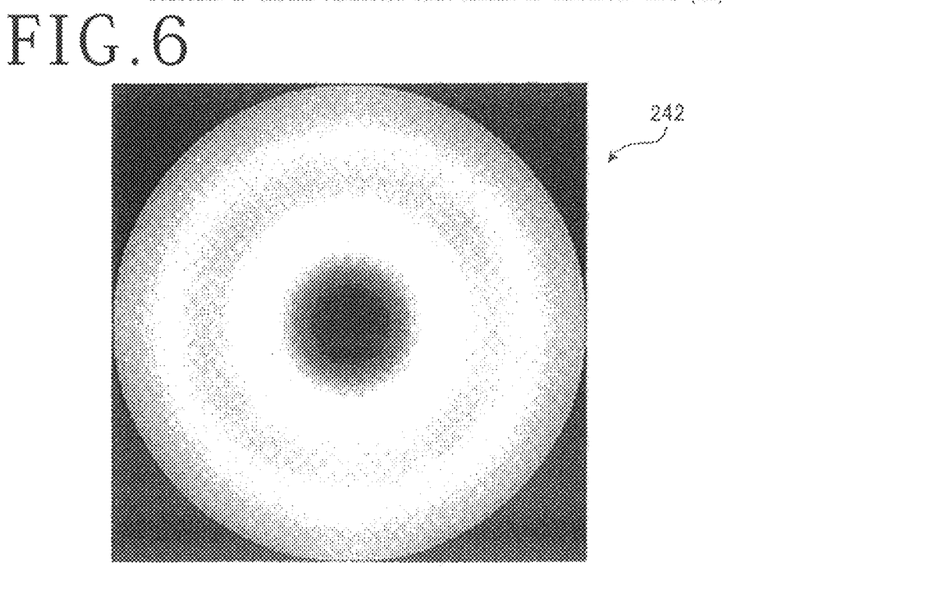
FIG. 6 is a diagram illustrating an example of a shape correction pattern.
Figure 7:
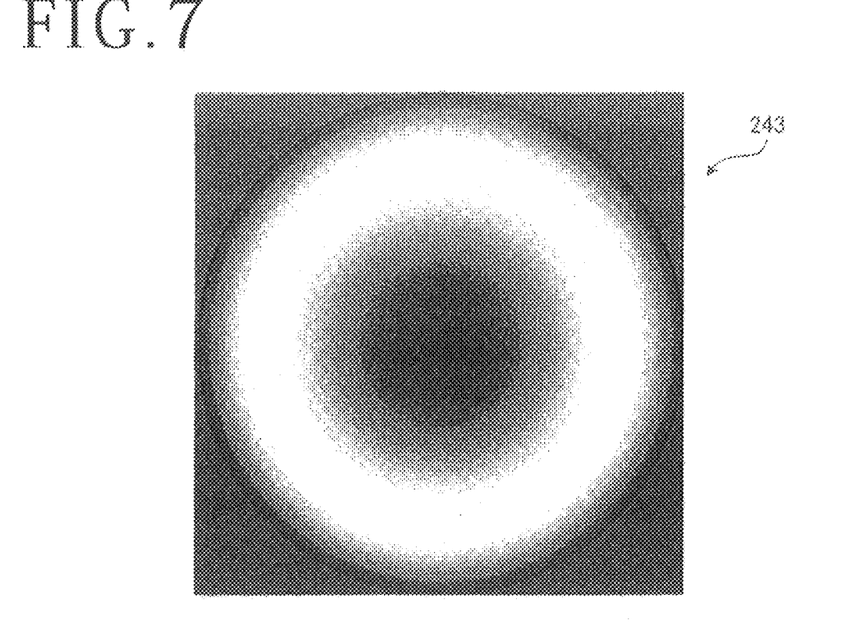
FIG. 7 is a diagram illustrating an example of an adjustment pattern.
Figure 8:
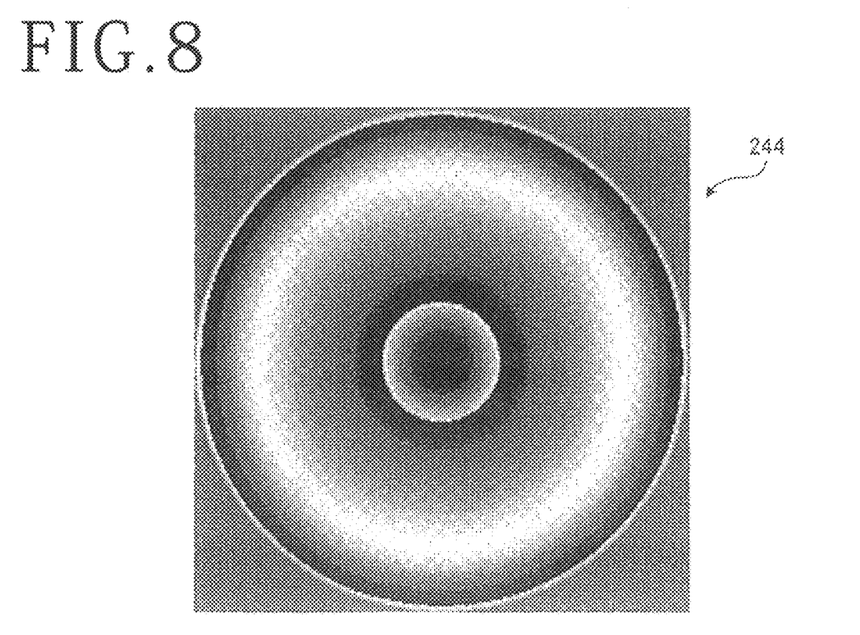
FIG. 8 is a diagram illustrating an example of a combined pattern.

FIG. 6 is a diagram illustrating an example of the shape correction pattern 242. FIG. 7 is a diagram illustrating an example of the adjustment pattern 243. FIG. 8 is a diagram illustrating an example of the combined pattern 244. In the shape correction pattern 242 illustrated in FIG. 6, the adjustment pattern 243 illustrated in FIG. 7, and the combined pattern 244 illustrated in FIG. 8, black areas indicate parts that transmit the laser beam 21, and white areas indicate parts that block the laser beam 21. Further, in gray areas, shadings, in other words, gradations indicate differences in phase modulation quantity.

The shape correction pattern 242 and the adjustment pattern 243 are combined together to provide the combined pattern 244. The combined pattern 244 is inputted by the operator from the input unit 80. The combined pattern 244 may be created by the control unit 90. In other words, the shape correction pattern 242 and the adjustment pattern 243 before their combination into the combined pattern 244 may be inputted to the input unit 80. As an alternative, the shape correction pattern 242 may be created by the control unit 90 based on the actual shape 2711 in terms of Z coordinates of the first surface 271 at the positions in the radial direction of the condenser lens 27 from the center thereof as inputted by the operator. As another alternative, the adjustment pattern 243 may be created by the control unit 90 based on preset values or the like inputted by the operator to adjust the optical characteristics.

Figure 9:
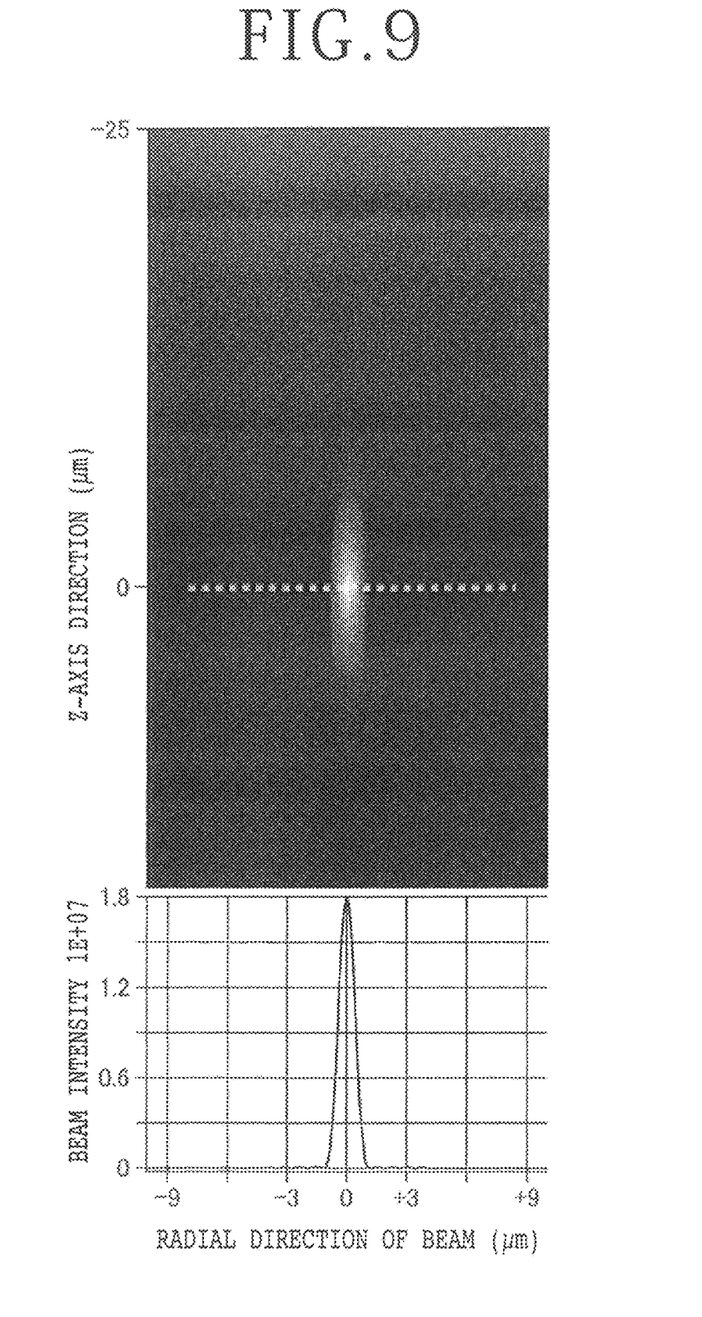
FIG. 9 indicates diagrams illustrating simulation results of a condensed state based on design values.
Figure 10:
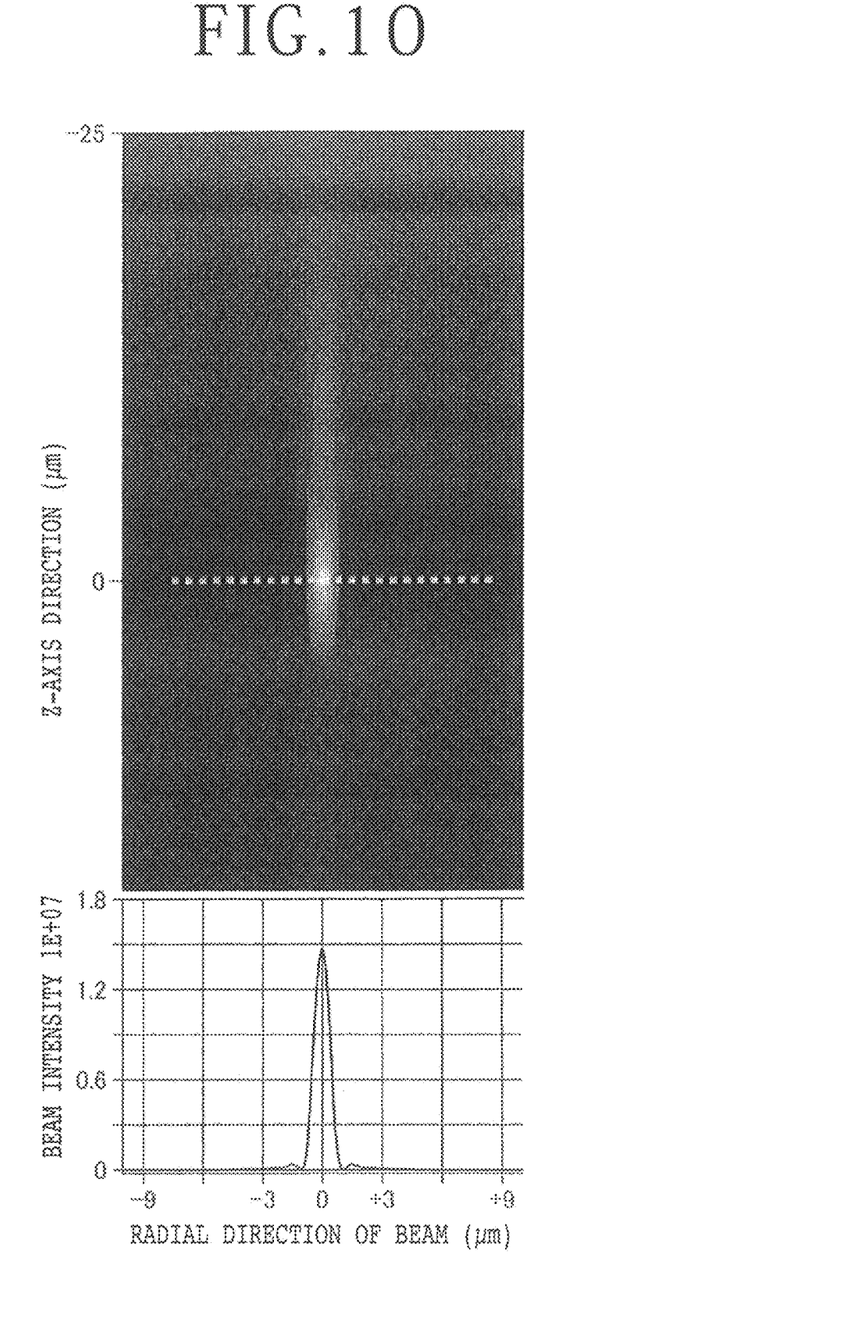
FIG. 10 indicates diagrams illustrating simulation results of a condensed state by a fitting function of an actual shape of the condenser lens.
Figure 11:
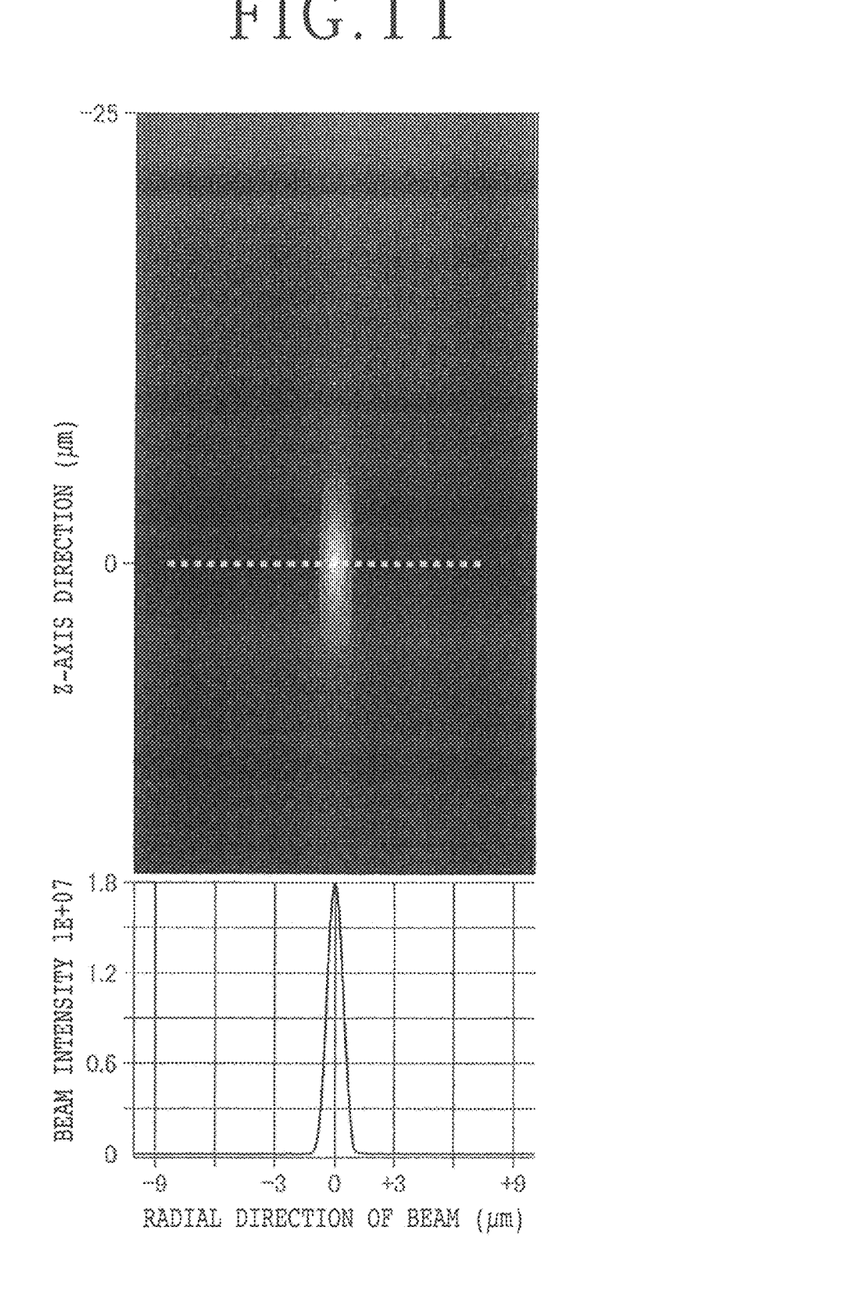
FIG. 11 indicates diagrams illustrating simulation results of a condensed state after shape correction.

Effects from the application of the shape correction pattern 242 will next be verified. FIG. 9 indicates diagrams illustrating simulation results of a condensed state based on the design values. FIG. 10 indicates diagrams illustrating simulation results of a condensed state by the fitting function 2712 of the actual shape 2711 of the condenser lens 27. FIG. 11 indicates diagrams illustrating simulation results of a condensed state after shape correction. FIGS. 9 to 11 illustrate energy distributions of the laser beam 21. It is to be noted that, in each of FIGS. 9 to 11, the upper diagram illustrates spot shapes in a cross-sectional direction of the workpiece 100, and the origin 0 in the Z-axis direction indicates the height of the processing points 28.

In each of FIGS. 9 to 11, the lower diagram illustrates the energy distribution in the radial direction at the origin 0 in the Z-axis direction. In the embodiment, the condenser lens 27 is assumed to have a numerical aperture of 0.8. Further, the laser beam 21 is assumed to have a wavelength of 1342 nm and a frequency of 100 kHz. Furthermore, the laser beam 21 that is incident into the condenser lens 27 is assumed to have a beam diameter of 10 mm. In addition, the simulations are conducted using "VirtualLab" as an evaluation software in the embodiment.

With the condenser lens 27 of the design values that provide the ideal wavefront, the beam diameter of the laser beam 21 condensed at the processing point 28 is about 2 μm as illustrated in FIG. 9. Further, the energy distribution of the laser beam 21 is a Gaussian distribution. As illustrated in FIG. 10, on the other hand, with the condenser lens 27 defined by the fitting function 2712 of the actual shape 2711, the energy distribution of the laser beam 21 condensed at the processing point 28 is indefinite at the tails of the Gaussian distribution, and has a beam diameter of substantially 4 μm. As appreciated from the foregoing, the spot shape at the processing point 28 is distorted from the predetermined spot shape due to the deviations of the spherical shape of the condenser lens 27 from its design values.

With the condenser lens 27 to which the shape correction pattern 242 has been applied, the laser beam 21 condensed at the processing point 28 has a beam diameter of substantially 2 μm as illustrated in FIG. 11. Further, the energy distribution of the laser beam 21 is not indefinite at the tails of a Gaussian distribution. As appreciated from the foregoing, the condenser lens 27 to which the shape correction pattern 242 has been applied can form a similar condensed state as the condenser lens 27 of the design values illustrated in FIG. 9.

Figure 12:
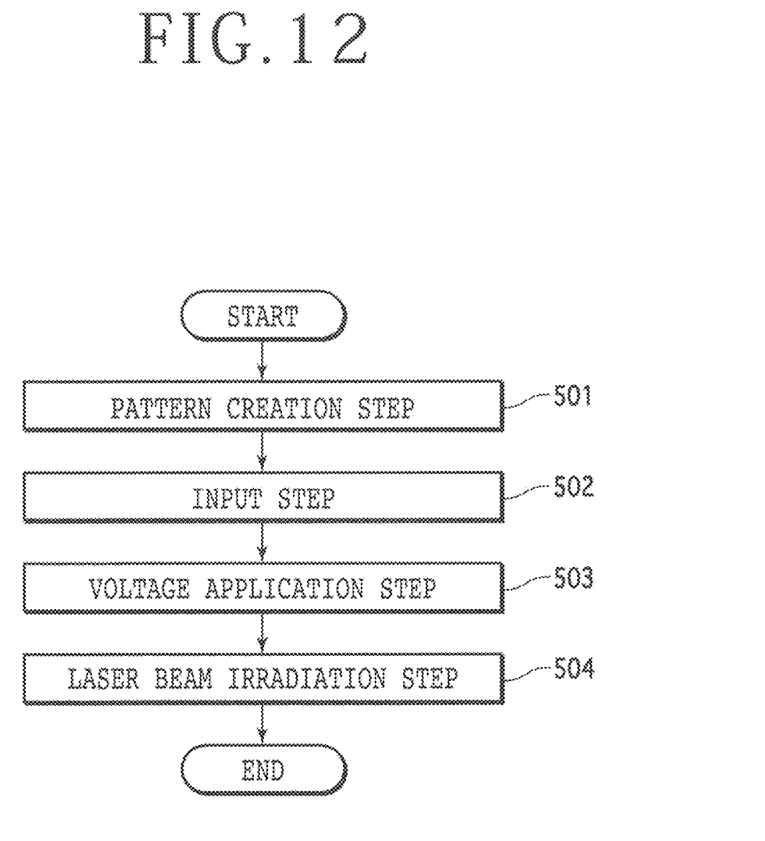
FIG. 12 is a flow chart illustrating a flow of an adjustment method according to the embodiment for the laser processing apparatus.

A description will next be made regarding a laser processing method by the laser processing apparatus 1. FIG. 12 is a flow chart illustrating a flow of an adjustment method according to the embodiment for the laser processing apparatus 1 in the processing method. The adjustment method includes a pattern creation step 501, an input step 502, a voltage application step 503, and a laser beam irradiation step 504.

The pattern creation step 501 creates a pattern by mapping the voltages to be applied to the phase modulation element 24. The pattern is the combined pattern 244 of the shape correction pattern 242 and the adjustment pattern 243. In the embodiment, the combined pattern 244 to be displayed at the display portion 241 of the phase modulation element 24 is created in the pattern creation step 501.

Described more specifically, in the pattern creation step 501, the fitting function 2712 in terms of Z coordinates of the first surface 271 of the condenser lens 27 is first created by fitting the actual shape 2711 in terms of Z coordinates of the first surface 271 at the radial positions from the center of the condenser lens 27. Next, assuming that the shape of the first surface 271 of the condenser lens 27 is represented by the fitting function 2712, aberrations after transmission through the condenser lens 27 are calculated, and based on the calculated aberrations, the shape correction pattern 242 is created using such correction values that provides an ideal wavefront. The shape correction pattern 242 and the adjustment pattern 243 are next combined together in the pattern creation step 501, thereby creating the combined pattern 244.

In the input step 502, the pattern created in the pattern creation step 501, specifically the combined pattern 244 is inputted from the input unit 80. Described specifically, the operator inputs from the input unit 80 the data of the combined pattern created, for example, by an external apparatus or the like with the pattern creation software installed therein. It is to be noted that the pattern creation software can be a dedicated software, Excel (registered trademark), or the like.

The voltage application step 503 applies the voltages which correspond to the pattern inputted in the input step 502, specifically, to the combined pattern 244, to the phase modulation element 24. Described more specifically, in the voltage application step 503, the control unit 90 acquires the combined pattern 244 inputted from the input unit 80. The control unit 90 outputs control signals to the phase modulation element 24 such that voltages are applied corresponding to the combined pattern 244. In the embodiment, the phase modulation element 24 causes the display portion 241 to display the combined pattern 244 when the voltages corresponding to the combined pattern 244 are applied from the control unit 90.

After the voltage application step 503, the laser beam irradiation step 504 relatively moves the workpiece 100 and the chuck table 10 while emitting the laser beam 21, whereby processing is applied to the workpiece 100. Described specifically, the moving unit 30 is moved to the processing position on the laser processing apparatus 1 in the laser beam irradiation step 504. The workpiece 100 is next imaged by the imaging unit 70 to detect the streets 103. After the detection of the predetermined one of the streets 103, an alignment is executed to perform position matching between the predetermined one street 103 on the workpiece 100 and the focal point on the laser processing apparatus 1.

In the laser beam irradiation step 504, the laser beam 21 is next applied to the workpiece 100. Here, based on processing details information recorded by the operator, the moving unit 30 moves in the X-axis direction and the Y-axis direction and also rotates about the axis parallel to the Z-axis direction.

In the laser beam irradiation step 504, the pulsed laser beam 21 of the wavelength having transmissivity through the workpiece 100 is applied from the side of the front surface 102 of the workpiece 100 with the processing point 28 as a focal point being positioned in the inside of the workpiece 100. As the laser processing apparatus 1 applies the laser beam 21 of the wavelength having transmissivity through the workpiece 100, the modified layers 106 are sequentially formed along the streets 103 in the inside of the substrate 101.

As described above, in the laser processing apparatus 1 according to the embodiment, the laser beam irradiation unit 20 includes the phase modulation element 24, and the voltages corresponding to the predetermined pattern are applied to the phase modulation element 24. The phase modulation element 24 can therefore prevent the individual differences of the condenser lens 27. The phase modulation element 24 is arranged between the laser oscillator 22 and the condenser lens 27 that condenses the laser beam 21 emitted from the laser oscillator 22. The predetermined pattern is the combined pattern 244 of the shape correction pattern 242 which is configured to correct the differences between the actual shape and the design values of the condenser lens 27, and the adjustment pattern 243 which is configured to adjust the optical characteristics of the laser beam 21 at the processing point 28.

A conventional laser processing apparatus includes a phase modulation element, such as an LCOS-type spatial optical modulator or a deformable mirror to which voltages are applied corresponding to an adjustment pattern (hereinafter referred to as "the conventional adjustment pattern") configured to adjust optical characteristics of a laser beam at each processing point. By inputting the combined pattern 244 of the conventional adjustment pattern and the shape correction pattern 242 configured to correct the differences between the actual shape 2711 of the condenser lens 27 and its design values, the laser beam 21 can be applied in a condensed state that the individual differences of the condenser lens 27 have been corrected. As a consequence, the laser processing apparatus 1 of the embodiment can prevent inter-apparatus differences. As the phase modulation element already installed in the conventional laser processing apparatus can be used as the phase modulation element 24 in the embodiment, there is no need for superfluous costs that would otherwise be required for addition of components, changes to the apparatus, and so on. The laser processing apparatus 1 of the embodiment can be realized at low cost.

It is to be noted that the present invention shall not be limited to the above-described embodiment. In other words, the present invention can be practiced with various modifications within the scope not departing from the spirit of the present invention. For example, the individual differences of the shape of the first surface 271 of the condenser lens 27 are corrected in the embodiment. As an alternative, the individual differences of the shape of the second surface 272 may be corrected, or the individual differences of both the first surface 271 and the second surface 272 may be corrected.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. An adjustment method for adjusting a condensed state of a laser beam to be applied to a workpiece in a laser processing apparatus including
a chuck table configured to hold the workpiece,
a laser beam irradiation unit configured to apply the laser beam to the workpiece held on the chuck table,
a moving unit configured to relatively move the chuck table and the laser beam irradiation unit,
a control unit configured to control at least the laser beam irradiation unit and the moving unit, and
an input unit configured to receive input information,
the laser beam irradiation unit including
a laser oscillator,
a condenser lens that condenses the laser beam emitted from the laser oscillator, and a phase modulation element arranged between the laser oscillator and the condenser lens, the method comprising:
- a pattern creation step of creating a pattern by mapping voltages to be applied to the phase modulation element,
- an input step of inputting the pattern which has been created in the pattern creation step, from the input unit,
- a voltage application step of applying voltages which correspond to the pattern inputted in the input step, to the phase modulation element, and
- a laser beam irradiation step of, after the voltage application step, relatively moving the workpiece and the laser beam while applying the laser beam, thereby applying processing to the workpiece, wherein the pattern to be created in the pattern creation step is a combined pattern of a shape correction pattern which is configured to correct differences between an actual shape and design values of the condenser lens; and an adjustment pattern which is configured to adjust optical characteristics of the laser beam at each processing point, wherein said shape correction pattern is generated in part by a fitting function based on orthogonal coordinates of positions from a center on a central longitudinal axis of said condenser lens.

2. The adjustment method of claim 1, wherein the condenser lens includes a first surface and an opposing second surface.

3. The adjustment method of claim 2, wherein said first surface of said condenser lens is a convex spherical surface and said second surface of said condenser lens is a concave spherical surface.

* * * * *